United States Patent

Jordan

[11] Patent Number: 6,058,255
[45] Date of Patent: May 2, 2000

[54] JTAG INSTRUCTION DECODE TEST REGISTER AND METHOD

[75] Inventor: Royce G. Jordan, Mesquite, Tex.

[73] Assignee: Texas Instruments Incorporated, Dallas, Tex.

[21] Appl. No.: 08/980,497

[22] Filed: Dec. 1, 1997

Related U.S. Application Data

[60] Provisional application No. 60/034,424, Dec. 17, 1996.

[51] Int. Cl.[7] ....................................................... G06F 17/50
[52] U.S. Cl. ............................................................ 395/500.05
[58] Field of Search ........................... 395/500.05, 500.36

[56] References Cited

U.S. PATENT DOCUMENTS 5,517,637  5/1996  Bruce et al. ......................... 395/500.05
5,689,516  11/1997  Mack et al. ............................. 371/22.2

*Primary Examiner*—Paul R. Lintz
*Assistant Examiner*—Thuan Do
*Attorney, Agent, or Firm*—Wade James Brady III; Frederick J. Telecky, Jr.

[57] ABSTRACT

A JTAG standard test system or similar test system with additional circuitry which greatly reduces the number of test vectors required to verify the instruction decode logic. This is accomplished by capturing the decodes from a previous instruction such that they can be sent out within a few clock cycles rather than requiring the many thousands of clock cycles needed to verify that the decodes were doing that which they were supposed to do in accordance with the prior art procedures. Since most of the decode logic used by the instructions is common to other instructions, the effect of the logic only has to be verified by a single instruction using that part of the decode. Following that single verification, if the instruction decode test register is included, verification of the decode for following instructions can be accomplished by simply reading out the value held in the instruction decode test register of the invention. The instruction decode test register is automatically loaded with the decode of the previous JTAG instruction. This method greatly reduces the redundancy that would be required for decode verification on ASICs that do not contain the instruction decode test register.

26 Claims, 2 Drawing Sheets

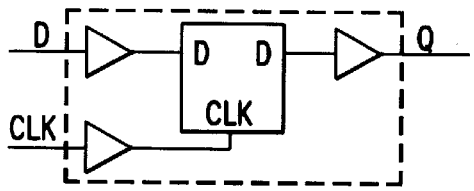
SIMPLE INTEGRATED CIRCUIT
*Fig.1* PRIOR ART
| VECTOR # | CLK | D | Q | COMMMENTS |
|---|---|---|---|---|
| 1 | L | L | X | the Q output is undefined |
| 2 | H | L | 0 | a "low" was latched into the register |
| 3 | L | H | 0 | |
| 4 | H | H | 1 | a "low" to "High" transition |
| 5 | L | L | 1 | |
| 6 | H | L | 0 | a "High to "low" transition |
| 7 | L | L | 0 | |
| 8 | H | L | 0 | "low" on Q for two consecutive clocks |
| 9 | L | H | 0 | |
| 10 | H | H | 1 | a "low" to "High" transition |
| 11 | L | H | 1 | |
| 12 | H | H | 1 | "high" on Q for two consecutive clocks |
*Fig.2* PRIOR ART
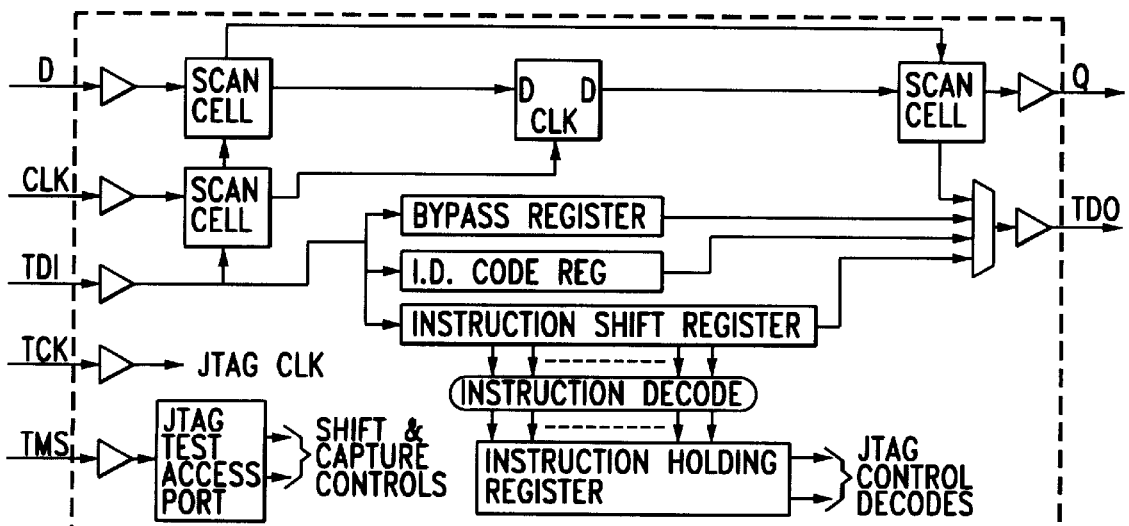
SIMPLE INTEGRATED CIRCUIT WITH JTAG
*Fig.3* PRIOR ART

JTAG INSTRUCTION DECODE TEST REGISTER AND METHOD

CROSS REFERENCE TO PRIOR APPLICATIONS

This application claims priority under 35 U.S.C. 119(e)(1) based upon Provisional Application Serial No. 60/034,424, filed Dec. 17, 1996.

BACKGROUND OF THE INVENTION

1. Field of the Invention

This invention relates to a system and method for testing devices which conform to IEEE standard 1149.1-1990 or IEEE standard 1149.1-1990 (including IEEE standard 1149.1a-1993) or similar scan architecture in general and preferably but not limited to such testing of application specific integrated circuits (ASICs).

2. Brief Description of the Prior Art

IEEE standard 1149.1 (JTAG—Joint Test Action Group Standard) establishes a boundary scan implementation for ASIC interconnect testing. The JTAG standard is a scan-based architecture disposed on the ASIC under test as a part of the circuitry thereof having a scan input (receives serial data at an input pin) and a scan output (receives serial data from the ASIC at an output pin). The ASIC also includes a mode pin which indicates the desired operating mode at any point in time, a clock pin and a reset pin.

ASICs are tested both before and after they are assembled into packages (e.g. dual-in-line packages or DIPs, leadless chip carriers or LCCs, pin grid arrays, quad flat packs, etc.). Before assembly into a package, ASICs can be probed by special machines utilizing special probe cards and test vectors which consist of sets of input signals, output signals and bidirectional signals. These test vectors are used to provide information to the probe machine such that the ASIC can be electrically stimulated and verified. Each vector contains a set of input signals (stimulus) and a set of output signals which are verified by the probe machine after application of the input stimulus for each test vector.

Once the preassembled ASICs are verified to be functional, they are assembled into a packaged part and retested using the same type of apparatus, which is now equipped with a socket instead of a set of probes. The same set of test vectors is utilized to verify post assembly operation.

The JTAG standard is for use in verification of both the ASICs and board level interconnect after the ASICs have been mounted onto a circuit board. Because of the density of routing in use at present and because of the use of ASICs which do not use pins that are accessible while mounted on these circuit boards, it is becoming increasingly difficult to test circuit boards and the ASICs mounted thereon after assembly. The JTAG 1149.1 standard is a scheme including special circuitry which is built into the individual ASICs utilizing a boundary scan register located between the normal ASIC functioning circuitry and the pins of the ASICs. The special test features of the JTAG standard allow the JTAG circuitry on the ASICs to take over the interface of the ASICs and drive the output signals of the ASICs such that they can be captured by the JTAG boundary scan of the ASICs with which they are interconnected on the circuit board. The JTAG circuitry can also be used in a similar manner to test the internal operation of the ASICs while they are mounted on the circuit board. This is accomplished under the control of an external standard JTAG controller via a five sill serial interface consisting of a clock (TCK), test mode select (TMS), test data in (TDI), test data out (TDO) and the optional test reset signal (TRST_).

Initially, an instruction is scanned into the instruction shift register of the ASIC via the scan input. At the end of the scan, the instruction in the instruction shift register is immediately decoded (expanded via combinational logic such that all control signals are set to the appropriate state to perform the function defined by the instruction) and the decoded instructions or instruction decodes are stored in a set of parallel latches. These instruction decodes are used to control the actions of the test logic.

There are only three instructions required by the 1149.1 JTAG standard, but there is an unlimited number of optional instructions and each instruction has its own decode. Each decode is a combination of the control bits used to specify the actions of the test logic. In order to fully test the JTAG standard circuitry, each instruction must be shifted into the instruction shift register and measurements made to determine the state of each bit of the decode. Due to the difficulty in verifying the state of these decode bits based upon the response of the external pins of the ASIC, up to several thousand test vectors may be required for each bit of each instruction, resulting in huge vector counts, long test times and extra tester costs being incurred. Because each instruction must be fully tested and since each instruction test requires many test vectors, ASICs that use more than just a few JTAG instructions require an unacceptable number of test vectors. (The term "test vector" is a description of the state of the pins of an ASIC at any instant in time.) It is apparent that a great deal of tester time and expense can be saved by reducing the number of test vectors required to test the JTAG circuitry on the ASIC.

A problem that is addressed by the present invention is the testing of the JTAG circuit itself. Since the JTAG circuitry is contained within each ASIC, it at be verified before the ASIC can be certified as operational. In the prior art, this test was accomplished by shifting in a test instruction and observing what the chip did in response and the decode was checked by observation of the operation of the device after the instruction was sent. This testing is accomplished at probe and repeated after the ASIC is assembled as described above. Since the only way to verify proper operation of the ASIC is by monitoring the response of its output pins to a given input stimulus, testing of JTAG circuitry can be both complicated and time consuming. While IEEE standard 1149.1a-1990 only requires three specific instructions, it allows an infinite number of instructions to be used as defined by the ASIC designers and system engineers to ease system testing. These tests are conducted by scanning in a JTAG instruction and then manipulating the inputs of the ASIC while monitoring the outputs to verify that the proper response is achieved. Since each instruction is decoded into many bits (which are used to control the JTAG circuitry and are updated immediately after a new instruction is scanned in), and since each bit must be verified to be decoded properly for each instruction, many thousands of vectors may be required for complete verification. This results in long test times and the concomitant high test costs.

SUMMARY OF THE INVENTION

The system in accordance with the present invention is a rapid testing means for the JTAG standard test circuitry that is already present on the ASIC and greatly reduces the number of test vectors required to verify the instruction decode logic. An object of the invention is to save clock cycles during the test of the JTAG circuitry. The actual decode of the test instruction can be observed in accordance with the present invention. Since the same logic gates are used to decode many instructions, a reduced test vector set can be used to verify that the decode circuit operates correctly in the JTAG circuitry. The invention verifies the proper operation of the JTAG circuitry itself in rapid manner.

This is accomplished by capturing the decodes from the instruction which immediately precedes this special test such that they can be sent out within a few clock cycles rather than requiring the many thousands of clock cycles needed to verify that the decodes were doing that which they were supposed to do in accordance with the prior art procedures. Since most of the decode logic used by the instructions is common to other instructions, the effect of the logic only has to be verified by a single instruction using that part of the decode. Following that single verification, if the instruction decode test register is included, verification of the decode for following instructions can be accomplished by simply shifting in the instruction whose decode is to be tested, shifting in the test instruction, shifting out the value held in the instruction decode test register and comparing it with the expected result. This comparison value is contained in the test vectors and is performed by the tester. The instruction decode test register is automatically loaded with the decode of the previous JTAG instruction. This method greatly reduces the redundancy that would be required for decode verification on ASICs that do not contain the instruction decode test register.

It follows that the preferred embodiment of the invention provides an additional test data register, referred to herein as the instruction decode test register, which is used to capture the decode of the previous JTAG instruction such that it can be shifted out and verified. When a JTAG instruction is shifted into the ASIC, this instruction decode test register captures the decode of the previous instruction before that decode is replaced with the decode of the new instruction. Since most of the decode bits are used by several different instructions, proper response to a decode bit by the ASIC only has to be shown once, and then the remainder of instructions using that decode bit can be verified by simply scanning out the decode via the instruction decode test register. This accomplishes in a few vectors what would otherwise take thousands of vectors, therefore saving tester time and expense.

More specifically, in accordance with the present invention, there is provided a means for reducing the number of test vectors required to verify that each instruction is decoded properly. It includes a shift register that is loaded with the decode of the prior JTAG instruction (from the latches described above in the prior art) before that decode is replaced with the decode of the current instruction. The data held in this shift register can then be shifted out using standard JTAG protocol and inspected to insure that it is correct. Given a circuit that consists of "n" bits of instruction decode and "m" instructions, there are "m" times "n" bits of instruction decode that must be tested using the prior art JTAG protocols and system. However, due to the addition of a further shift register stage (the instruction decode test register) which is added in accordance with the present invention to capture and shift the decode out for inspection, it is only necessary to insure that a decode bit is functional once. Thereafter, each subsequent instruction can be verified by simply checking the state of the bit rather than the reaction of the pins of the device.

Assuming an ASIC which utilizes only 10 JTAG instructions and only 10 bits of instruction decode, if each JTAG instruction requires 2000 test vectors to verify proper operation of all 10 instruction decode bits for that particular instruction, 20,000 test vectors would be required using the prior art JTAG system and protocol. However, utilizing the present invention, only a few instructions would be required to verify the decodes using the response at the system pins of the ASIC and the remaining instructions could be verified using a simple JTAG scan. Assuming three instructions at 2000 test vectors each and about 50 test vectors each for the remaining seven instructions, the test would only require 6,350 test vectors instead of 20,000. Although the numbers vary depending upon the type of instructions included, the number of instructions used and the number of instruction decode bits used, this example provides a rough idea of the concept of the invention herein.

As another example, a given ASIC utilizes several different instructions which select the boundary scan register for shifting. In order to show that the boundary scan register was selected for each instruction, prior art would require shifting a data stream through the selected register (which was 183 bits long). In tins ASIC, four bits of the 20 instruction decode bits are used to select the correct path, and the instruction length is 8 bits. Therefore, if the prior art JTAG circuitry is utilized to verify the decode, each instruction would require about 200 test vectors just to verify that those four decode bits were correct. Given that there were six instructions which selected that specific shift register, 1200 test vectors are required for testing 20% of the decode bits using the prior art system and protocol as opposed to about 500 test vectors using the present invention. Further, these 500 test vectors would also verify the other 80% of the bits of the last five instructions.

BRIEF DESCRIPTION OF THE DRAWINGS

FIG. 1 is a block diagram of a simple prior art integrated circuit for use in describing the procedures in accordance with the present invention;

FIG. 2 is a table showing simple circuit test vectors in accordance with the prior art;

FIG. 3 is a simple integrated circuit with JTAG in accordance with prior art;

DESCRIPTION OF THE PREFERRED EMBODIMENT

Figure 4:
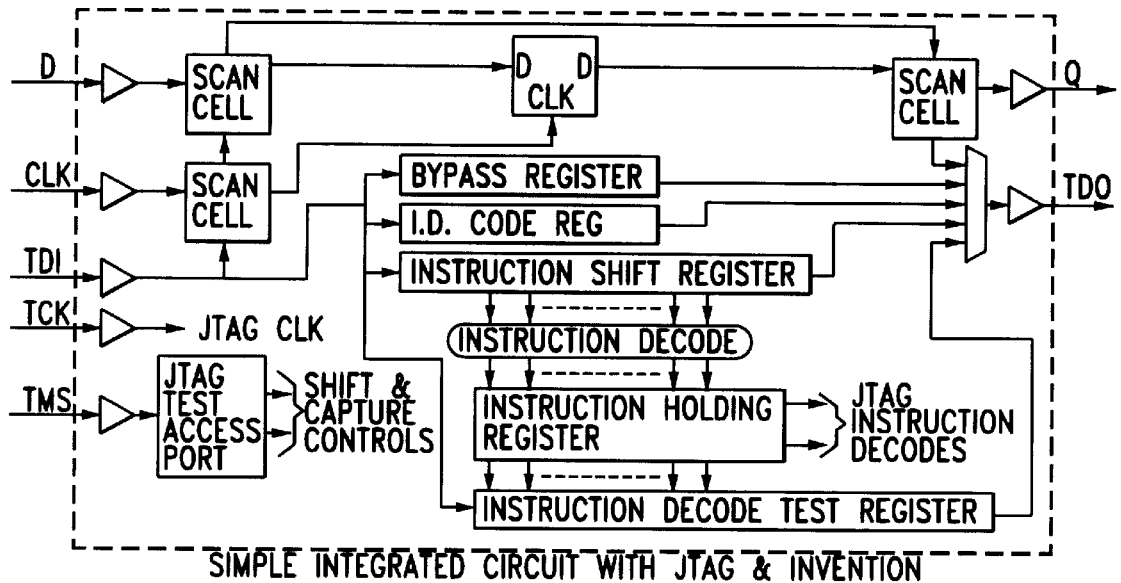
FIG. 4 is a simple integrated circuit with JTAG and the features in accordance with the present invention.

Referring to FIG. 1, there is shown a very simple prior art integrated circuit (IC) for the purpose of simplifying the following description of the preferred embodiment. This circuit is a register which latches data from its D input on the rising edge of its clock (clk) input and drives that value out on its Q output.

Testing of the integrated circuit of FIG. 1 takes place in two stages. In the first stage, the IC is tested while it is still on the wafer. This is accomplished using a tester which contains probes placed on the pads of the IC and which applies signals to the pads associated with the inputs D and clk and measures the response at the pad associated with the output Q. After passing these tests, the wafer is cut up into individual die (individual ICs before packaging) and then placed in a package. These packages may be dual-in-line packages (DIPs), leadless chip carriers (LCCs), single in-line packages (SIPs), pin grid arrays (PGAs) or one of many other packaging methods. However, each package includes a mechanism for holding the die and connecting the die to the exterior of the package such that the signals can enter and exit the IC through the package. In the following discussion, these connections on the ICs will be referred to as "pins".

The application of a single set of input stimuli followed by the measurement of the output values at a given point in time is referred to as one test vector. The test vector contains the input values to be applied and the expected output value resulting from that set of inputs at an instant in time. The tester must apply the inputs, measure the output values and compare these output values to the values contained in the test vector. An error is flagged when the expected and measured outputs do not match. In the following discussion, "H" and "L" are used for high and low input values respectively and "1" (high) and "0" (low) are used for output values.

For the IC of FIG. 1, the test consists of only a few vectors, twelve (12) such vectors being shown in the table of FIG. 2. Test vector #1 sets the D and clk inputs low, whereby the Q output is undefined since it would not be possible to predict the value of the Q output without already clocking it into the IC. Test vector #2 contains a low on input D and a high on the clk input to provide a low on the Q output since that is the value which would be on the output if operating correctly. Test vector #3 contains a high on the D input and a low on the clk input to provide a low on the Q output. Test vector #4 contains a high on the D input, a high on the clk input and a high on the Q output. For a full test, the output is checked to see that it transitions based upon all combinations of present input and output values resulting in 10 to 12 vectors for a simple functional test, twelve (12) such vectors being shown in prior art FIG. 2 for testing the circuit of FIG. 1. It is noted that typical ICs contain much more complicated circuitry than the simple circuit of FIG. 1 and therefore require many more test vectors than are illustrated herein. A typical IC can easily require on the order of one million test vectors due to the number of internal circuits contained therein (e.g., registers, latches, NAND gates, etc.)

IEEE Std. 1149.1a-1990 (JTAG) specifies a method of inserting test logic into an IC such that the IC itself can be used to test the interconnect between itself and other ICs in the system which also contain JTAG circuitry as shown in prior art FIG. 3. The circuitry itself includes a JTAG test access port (TAP), a boundary scan register which includes a boundary scan cell for each input and output excluding the JTAG interface pins TCK, TMS, TDI and TDO, a bypass register which is a JTAG specific shift register, an instruction shift register, instruction decode logic and an instruction holding register. Further, the circuitry allows use of additional circuitry such as, for example, the ID code register shown in FIG. 3.

The JTAG circuit of FIG. 3 is used for testing external interfaces to the IC, for testing internal circuits and for setting up areas of the IC for specialized tests. JTAG operation utilizes two types of scans called instruction scans and data scans. An instruction scan consists of the JTAG TAP controller selecting the instruction shift register and shifting data into that shift register via the TDI pin. At the end of the shift, the data which was shifted into the instruction shift register is decoded (expanded into a set of control bits, hereafter called instruction decodes) by the instruction decode logic and then latched into the instruction decode holding register where it is held until it is updated at the end of the next instruction shift. These instruction decodes are used to select which data register is selected for data scan, the operation of the boundary scan register ("test" or "normal" mode) and any number of IC specific tasks as defined by the IC designer. The exact use of these bits is well known, is not relevant to the discussion of the present invention and is therefore not further discussed herein.

A data scan consists of a three step process in which the register specified by the instruction decode bits (1) captures data, (2) shifts that data out (while shifting in new data) and then (3) updates the new data into a given location at the end of the shift. The details of this operation are well known, not important to the invention and are therefore omitted.

When the JTAG circuitry is to be used for testing system level interconnects, it is used in either "test" mode or "normal" mode. In "normal" mode, the boundary scan register is configured such that the values from the input pins are passed directly to the core logic (the part of the IC other than the I/O buffers which would be present without JTAG) through the input scan cells and the values from the core logic are passed through the output scan cells directly to the output pins. This mode allows the core logic of the ICs to function as if JTAG were not present in the IC. When the IC is operating in the "normal" mode, the boundary scan register is used to take "snapshots" of the values present on the pins of the IC whenever directed to do so by the external JTAG controller (the circuitry that is not a part of the IC and which is used to control the JTAG interface pins TMS and TDI).

When the IC is in the JTAG "test" mode, the boundary scan cells are controlled such that the data fed to the core logic inputs is sourced by the holding latch contained in the boundary scan input cells and the data fed to the IC output buffers is sourced by the latches contained in the boundary scan output cells. This functionality allows the boundary scan register to isolate the core logic from being effected by external I/O other than the JTAG controller.

The "test" mode is used while the IC is mounted in the system for interconnect testing (and may also be used to test the core logic of the IC). This is accomplished by using a sequence of data scans to load values into the output cells of the boundary scan registers for use in driving the output pins of an IC and capturing those values at the input cells of the boundary scan register of whichever IC is connected to that output cell. This captured data is shifted out and compared to the expected data values to determine if the system level IC interconnects are operational.

Since the JTAG circuitry is contained in the IC, it must be verified to be fully operational before the IC can be declared to be fully functional. One of the more complicated areas in this verification is the area of JTAG Instruction Decodes. The decodes are the mechanism via which the JTAG circuitry controls the selection of data scan paths, selection of test or normal mode, initiation of special test features, control of IC specific test operations, etc. Because these instruction decodes are not accessible at the pins of the IC, they cannot be tested simply or quickly. However, each instruction decode bit of each instruction must be tested to ensure proper operation before the IC can be declared to be functionally sound.

A subset of the verifications required without the present invention is as follows:

a) A data scan for each instruction in spite of the fact that many instructions select the same scan paths and that data scans such as the boundary scan path(s) and internal scan path(s) are long chains of shift registers requiring many test vectors to complete a single scan.

b) A test for every instruction to ensure that the instruction was in the correct mode (either "test" or "normal"

mode) by applying a sequence of vectors to the inputs and measuring the outputs to determine whether the input values propagated through the IC.

c) Testing any special instruction decodes, such as, for example, instruction decodes that initiate internal test functions for every such instruction to determine whether each instruction initiates its associated internal test function.

d) verification of specialized instruction decodes (such as the instruction decode bit to turn off the pullups on the pins of the IC) to ensure that such specialized instruction decodes be in the proper state not only for the instruction that activates them, but also for the instructions that are not supposed to activate them.

It should again be noted that the instruction decodes have a defined value for every JTAG instruction and therefore some method of verification of every instruction decode bit must be accomplished for every possible JTAG instruction. This has a compounding effect since a simple 1000 vector test, for example, to verify a single instruction decode bit must be run for every instruction. This results in tens of thousands of test vectors per bit of instruction decode in the IC.

Figure 5:
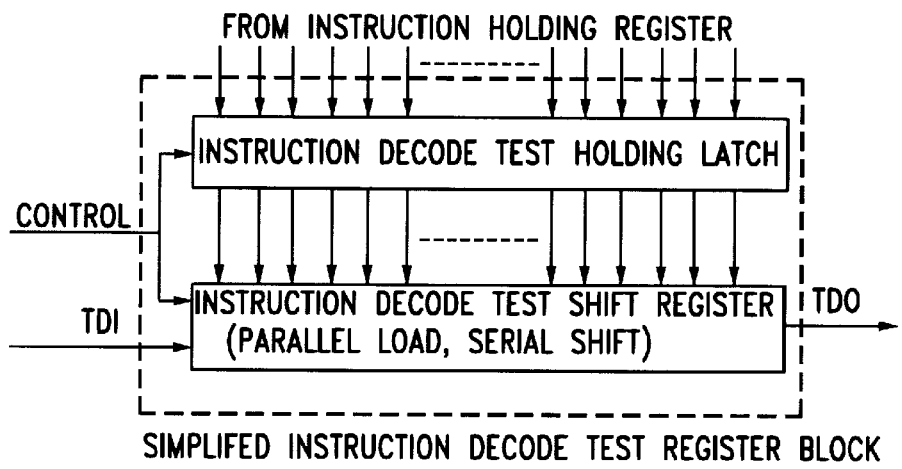
FIG. 5 is a block diagram of the instruction decode test register block of FIG. 4.

FIG. 4 shows the circuit of FIG. 3 with the inventive features herein (instruction decode test register) added. An expanded block diagram of the instruction decode register is shown in FIG. 5.

When the IC includes the circuitry in accordance with the present invention, test vector counts are greatly reduced by a combination of reducing the vectors necessary to verify an instruction decode bit for a single instruction and because the invention is such that all of the instruction decode bits for a given instruction are shifted out for inspection in a single data scan.

Since the values of the instruction decodes are accessible via a JTAG data scan path, an instruction A, for example, would be shifted into the IC's instruction shift register via the scan input (TDI), the INDEC instruction to select the instruction decode register as the path for the JTAG data scan is shifted into the IC's instruction shift register via the scan input and then a data scan is performed to shift the entire set of instruction decodes for instruction A out via the scan output (TDO). Using this technique and the instruction decode register, the prior subset of verification required without the present invention is reduced by the present invention as follows:

a) Each data scan path is selected by a specific instruction decode. This requires a data scan per path rather than a data scan per path per instruction.

b) The "test"/"normal" mode instruction decode is verified to operate for both "test" and "normal" modes. This requires two instructions and the associated application of a sequence of vectors to the inputs and measuring of the outputs to see if the input values propagated through the IC, instead of requiring that every instruction be shifted into the instruction shift register via the scan input, one at a time, and the associated application of the sequence of vectors to the inputs and measuring the outputs to see if the input values propagated through the IC.

c) Any special instruction decodes such as decodes that initiate internal test functions are only tested for one instruction to determine whether that special instruction decode initiated that internal test function as well as one instruction that does not initiate the internal test function.

d) Specialized instruction decodes (such as the instruction decode bit to turn off the pullups on the pins of the IC) are verified for an active and an inactive instruction as in c) above.

e) The remainder of the test is a sequence of simply inputting the instruction whose decode is to be verified, inputting the INDEC instruction and scanning out the associated decode for verification.

In operation, when the device is in the test mode, a test instruction which is to be executed by the JTAG circuitry of the ASIC is first serially transmitted to the ASIC on the TDI input pin in accordance with the 1149.1 standard, using the TCLK input to clock the data into the instruction shift register. After the instruction is received into the instruction shift register, it is subsequently decoded into an expanded test instruction by the instruction decode circuitry, which will typically be formed of conventional combinational logic for decoding or other decoding circuitry as is well known to those skilled in the art. The decoded instruction is then captured into the instruction holding register. The outputs of the instruction holding register drive various circuits on the ASIC for performing the desired test. Simultaneously, the data in the instruction decode holding register is captured by the instruction decode test register.

The instruction decode test register is a parallel load, serial shift register. After it is loaded with the decoded instruction from the instruction holding register, it is shifted out through the TDO serial test data output pin in response to a control signal sent on the TDI serial test data input pin. The contents of the instruction decode test register may be captured by another device and compared to the expected decode for the particular test instruction. Thus, the decode of the JTAG instruction can be verified as correct or identified as incorrect. The use of the invention described herein thus enables rapid verification of the proper operation of the instruction register shift register, instruction decode circuitry and the instruction holding register. This rapid verification of correct operation was not possible in the JTAG circuitry of the prior art.

An alternative arrangement which is also contemplated is to include not only the instruction decode test register for receiving the contents of the instruction holding register, but also an on board comparator and an additional test register for receiving an expected decode data word. In this arrangement, an expected decode data word could be shifted into the comparator logic, using the TDI input, then the steps described above would be performed to decode an instruction. Now, instead of transmitting the contents of the instruction decode register serially for a comparison off chip with an expected decode as described above, the on board comparator could compare the contents of the instruction decode register with the expected decode and output an indicator which would indicate that there was a match or a failure to match, based upon the outcome of the comparison.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A system for testing a semiconductor device comprising:

a semiconductor chip having functioning circuitry for functioning in a predetermined manner and test circuitry for testing for the proper functioning of said functioning circuitry, said test circuitry including:

(i) decoding circuitry for decoding instruction data;
(ii) an instruction holding register for storing said decoded instructions; and
(iii) an instruction decode test register for receiving the output of said instruction holding register and for outputting the decoded instruction data for comparing with an expected instruction decode.

2. The system of claim 1 wherein said instruction decode test register includes comparison circuitry for comparing the contents of said instruction decode register with expected decoded instruction data.

3. The system of claim 2 wherein said test circuitry conforms to IEEE standard 1149.1-1990.

4. The system of claim 2 wherein said device is an integrated circuit.

5. The system of claim 2 further including circuitry responsive to said device being in the test mode for applying said instruction data to inputs of said functioning circuitry and circuitry responsive to the test circuitry of said chip for capturing and observing internal actions of said chip.

6. The system of claim 2 further including circuitry to compare the output of said instruction decode test register with said expected output, said circuitry to compare being external to said chip.

7. The system of claim 3 wherein said device is an integrated circuit.

8. The system of claim 3 further including circuitry responsive to said device being in the test mode for applying said instruction data to inputs of said functioning circuitry and circuitry responsive to the test circuitry of said chip for capturing and observing internal actions of said chip.

9. The system of claim 8 further including circuitry to compare the output of said instruction decode test register with said expected output, said circuitry to compare being external to said chip.

10. The system of claim 1 wherein said test circuitry conforms to IEEE standard 1149.1-1990.

11. The system of claim 10 wherein said device is an integrated circuit.

12. The system of claim 10 further including circuitry responsive to said device being in the test mode for applying said instruction data to inputs of said functioning circuitry and circuitry responsive to the test circuitry of said chip for capturing and observing internal actions of said chip.

13. The system of claim 1 wherein said device is an integrated circuit.

14. The system of claim 1 further including circuitry responsive to said device being in the test mode for applying said instruction data to inputs of said functioning circuitry and circuitry responsive to the test circuitry of said chip for capturing and observing internal actions of said chip.

15. The system of claim 1 further including circuitry to compare the output of said instruction decode test register with said expected output, said circuitry to compare being external to said chip.

16. An integrated circuit having test circuitry, comprising:
(a) application logic circuitry for providing a desired function for the integrated circuit;
(b) test circuitry for verifying the operation of the application logic circuitry, said test circuitry comprising:
(i) a test data input for receiving serial test data and instructions;
(ii) a test data output for transmitting serial test data and instructions;
(iii) an instruction shift register coupled to said test data input for receiving test instructions;
(iv) an instruction decode circuit coupled to said instruction shift register for decoding a plurality of predetermined test instructions received in said test instruction register;
(v) an instruction decode holding register for receiving the output of said instruction decode circuit and for outputting test control signals which represent a particular test instruction; and
(vi) an instruction decode test register for receiving the output of said instruction holding register.

17. The circuitry of claim 16 wherein said test circuitry further comprises:
(vii) comparison circuitry for comparing the contents of said instruction decode test register with an expected decoded test instruction.

18. The circuitry of claim 16 wherein said instruction decode test register is coupled to said test data output for transmitting the contents of said instruction decode test register to an external comparator for comparing the decoded test instruction to said expected decode.

19. A method for testing a semiconductor device comprising the steps of:
(a) providing a semiconductor chip having functioning circuitry for functioning in a predetermined manner and test circuitry for testing for the proper functioning of said functioning circuitry, said test circuitry including:
(i) decoding circuitry for decoding instruction data;
(ii) an instruction holding register for storing said decoded instructions; and
(iii) an instruction decode test register for receiving the output of said instruction holding register
(b) decoding said instruction data in said decoding circuitry;
(c) storing said decoded instructions in said instruction holding register;
(d) capturing the decoded instruction data in said instruction decode test register; and
(e) outputting the contents of the instruction decode test register for comparison.

20. The method of claim 19 wherein said test circuitry conforms to IEEE standard 1149.1-1990.

21. The method of claim 20 wherein said device is an integrated circuit.

22. The method of claim 20 further including the step of applying said instruction data to inputs of said circuitry for functioning and responsive to the output of said chip, capturing and observing internal actions of said chip.

23. The method of claim 21 further including the step of applying said instruction data to inputs of said circuitry for functioning and responsive to the output of said chip, capturing and observing internal actions of said chip.

24. The method of claim 19 wherein said device is an integrated circuit.

25. The method of claim 21 further including the step of applying said instruction data to inputs of said circuitry for functioning and responsive to the output of said chip, capturing and observing internal actions of said chip.

26. The method of claim 19 further including the step of applying said instruction data to inputs of said circuitry for functioning and responsive to the output of said chip, capturing and observing internal actions of said chip.

* * * * *